US011378468B2

(12) United States Patent
Keith et al.

(10) Patent No.: US 11,378,468 B2
(45) Date of Patent: Jul. 5, 2022

(54) SENSOR MODULE AND PROCESS FOR PRODUCING SAME

(71) Applicant: Thermodata Corporation, Milwaukee, WI (US)

(72) Inventors: Robert Keith, Milwaukee, WI (US); Jenny Samfat, Milwaukee, WI (US)

(73) Assignee: Brightsentinel Limited, Cambridge (GB)

( * ) Notice: Subject to any disclaimer, the term of this patent is extended or adjusted under 35 U.S.C. 154(b) by 105 days.

(21) Appl. No.: 15/235,877

(22) Filed: Aug. 12, 2016

(65) Prior Publication Data

US 2018/0045585 A1 Feb. 15, 2018

(51) Int. Cl.
| | |
|---|---|
| *G01K 7/01* | (2006.01) |
| *G01K 17/00* | (2006.01) |
| *G01K 15/00* | (2006.01) |
| *G01K 1/08* | (2021.01) |
| *G01K 1/02* | (2021.01) |
| *H05K 3/00* | (2006.01) |

(52) U.S. Cl.
CPC ............ *G01K 15/005* (2013.01); *G01K 1/026* (2013.01); *G01K 1/08* (2013.01); *H05K 3/0052* (2013.01)

(58) Field of Classification Search
CPC ............ G01K 7/01; G01K 7/00; G01K 1/143; G01K 7/425; G01K 13/00; G01K 15/00; G01K 17/00; G01K 2217/00; G01N 27/4148; G01N 15/0656; G01N 2291/02881; G01N 35/00613

USPC .......... 374/178; 324/754.08, 756.02, 757.04, 324/76.11
See application file for complete search history.

(56) References Cited

U.S. PATENT DOCUMENTS

| | | | | |
|---|---|---|---|---|
| 3,842,346 | A | * | 10/1974 | Bobbitt ................... G06F 11/24 324/522 |
| 4,261,086 | A | | 4/1981 | Giachino et al. |
| 4,565,092 | A | | 1/1986 | Kompelien |
| 5,321,638 | A | | 6/1994 | Witney |
| 5,377,128 | A | | 12/1994 | McBean |
| 5,406,212 | A | * | 4/1995 | Hashinaga ......... G01R 31/2874 324/750.07 |
| 5,773,764 | A | | 6/1998 | Von Vajna |
| 6,104,611 | A | * | 8/2000 | Glover .................... F28D 15/06 165/104.33 |
| 6,450,005 | B1 | | 9/2002 | Bentley |
| 6,786,639 | B2 | * | 9/2004 | Covi ........................ G01K 7/00 324/525 |
| 7,117,747 | B2 | | 10/2006 | Borzabadi et al. |

(Continued)

FOREIGN PATENT DOCUMENTS

TW 200830437 A * 7/2008

OTHER PUBLICATIONS

Qiu et al., Sensors and Actuators A 92 (2001) 80-87.
(Continued)

*Primary Examiner* — Gail Kaplan Verbitsky
(74) *Attorney, Agent, or Firm* — Gibraltar Consulting LLC; Tariq S. Najee-ullah

(57) ABSTRACT

The present disclosure provides a combined fabrication and calibration process for sensor modules and temperature sensor modules in particular. The present disclosure also provides the completed calibrated sensor module and an electronic device containing the calibrated sensor module.

16 Claims, 8 Drawing Sheets

(56) References Cited

U.S. PATENT DOCUMENTS

| | | | | |
|---|---|---|---|---|
| 7,419,299 | B2* | 9/2008 | Akram | G01K 1/026 |
| | | | | 257/48 |
| 7,478,303 | B2* | 1/2009 | Hopkins | H04L 12/40052 |
| | | | | 714/734 |
| 7,516,543 | B2* | 4/2009 | Woerner | B01L 3/502707 |
| | | | | 204/400 |
| 8,067,934 | B2* | 11/2011 | Janke | G01R 33/07 |
| | | | | 324/207.15 |
| 8,212,528 | B2* | 7/2012 | Takeda | H01M 10/48 |
| | | | | 320/134 |
| 8,801,279 | B2* | 8/2014 | Kim | G01K 7/01 |
| | | | | 374/152 |
| 8,845,188 | B2* | 9/2014 | Bash | G01K 1/026 |
| | | | | 374/1 |
| 9,010,999 | B2* | 4/2015 | Schuler | G01K 7/16 |
| | | | | 374/178 |
| 9,024,622 | B2 | 5/2015 | Hohe et al. | |
| 9,294,092 | B2* | 3/2016 | Hutton | H03K 19/0033 |
| 9,658,678 | B2* | 5/2017 | Shoemaker | G01K 3/08 |
| 2003/0219062 | A1 | 11/2003 | Egidio | |
| 2008/0105942 | A1* | 5/2008 | Huang | H01L 24/97 |
| | | | | 257/434 |
| 2008/0197438 | A1* | 8/2008 | Chan | H01L 21/78 |
| | | | | 257/434 |
| 2009/0141771 | A1* | 6/2009 | Owen | G01K 1/14 |
| | | | | 374/178 |
| 2011/0048790 | A1 | 3/2011 | Graf | |
| 2012/0199065 | A1* | 8/2012 | Wieting | H01L 21/67173 |
| | | | | 118/704 |
| 2015/0160089 | A1 | 6/2015 | Dawson et al. | |
| 2016/0018281 | A1 | 1/2016 | Hammerschmidt | |
| 2017/0271241 | A1* | 9/2017 | Marimuthu | H01L 24/19 |

OTHER PUBLICATIONS

Valle-Mayorga, Javier. "One-wire interface over power pin for sensor signal conditioner calibration", EDN Network, Feb. 16, 2016, XP55416318. https://www.edn.com/design/analog/4441438/One-wire-interface-over-power-pin-used-in-the-calibration-of-sensor-signal-conditioners; Retried on Oct. 17, 2017.

* cited by examiner

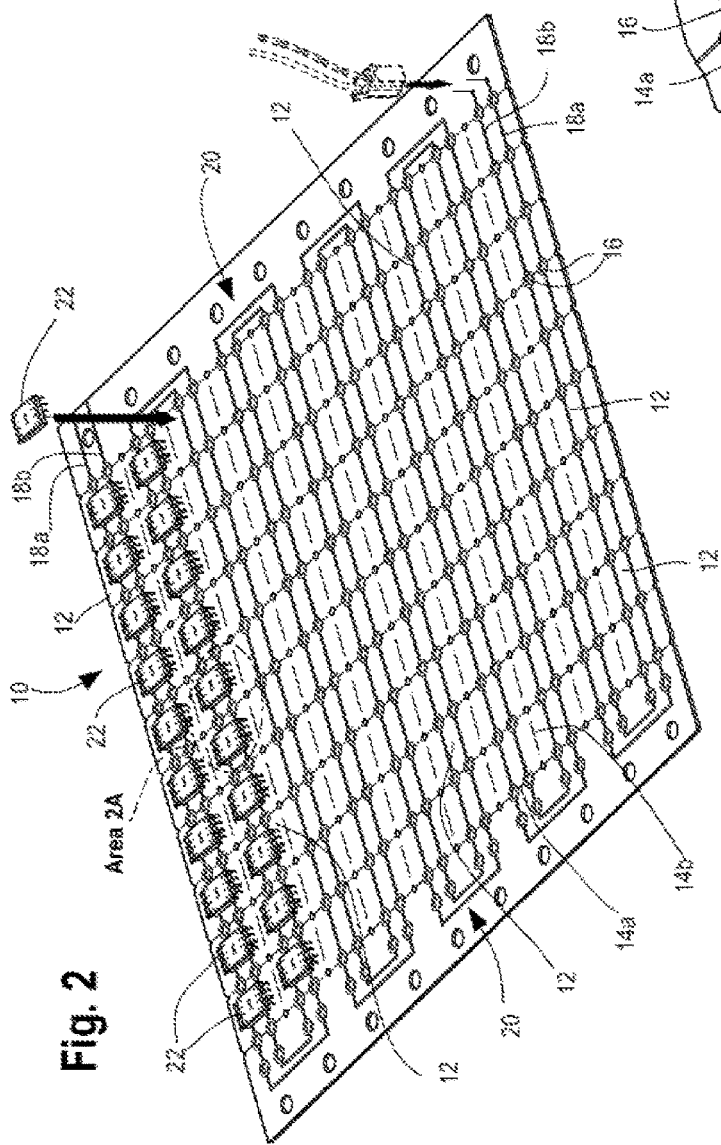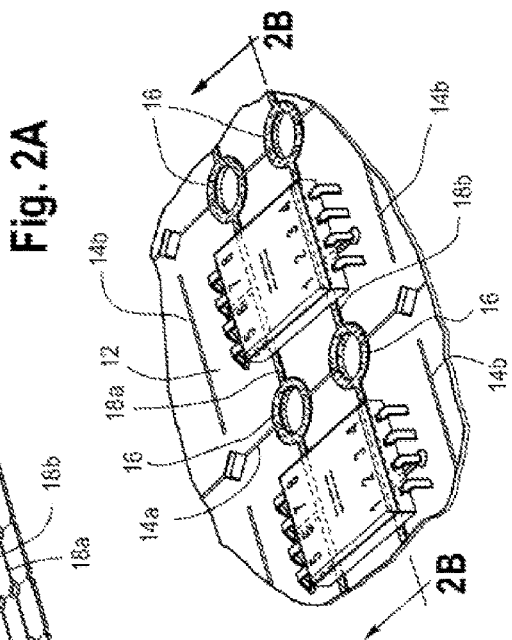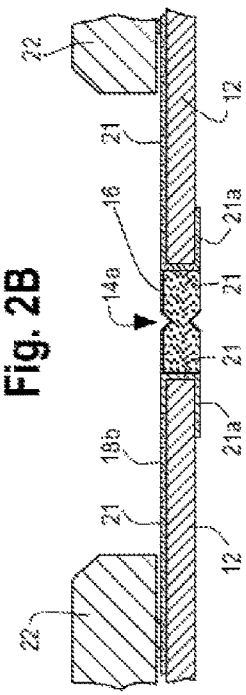

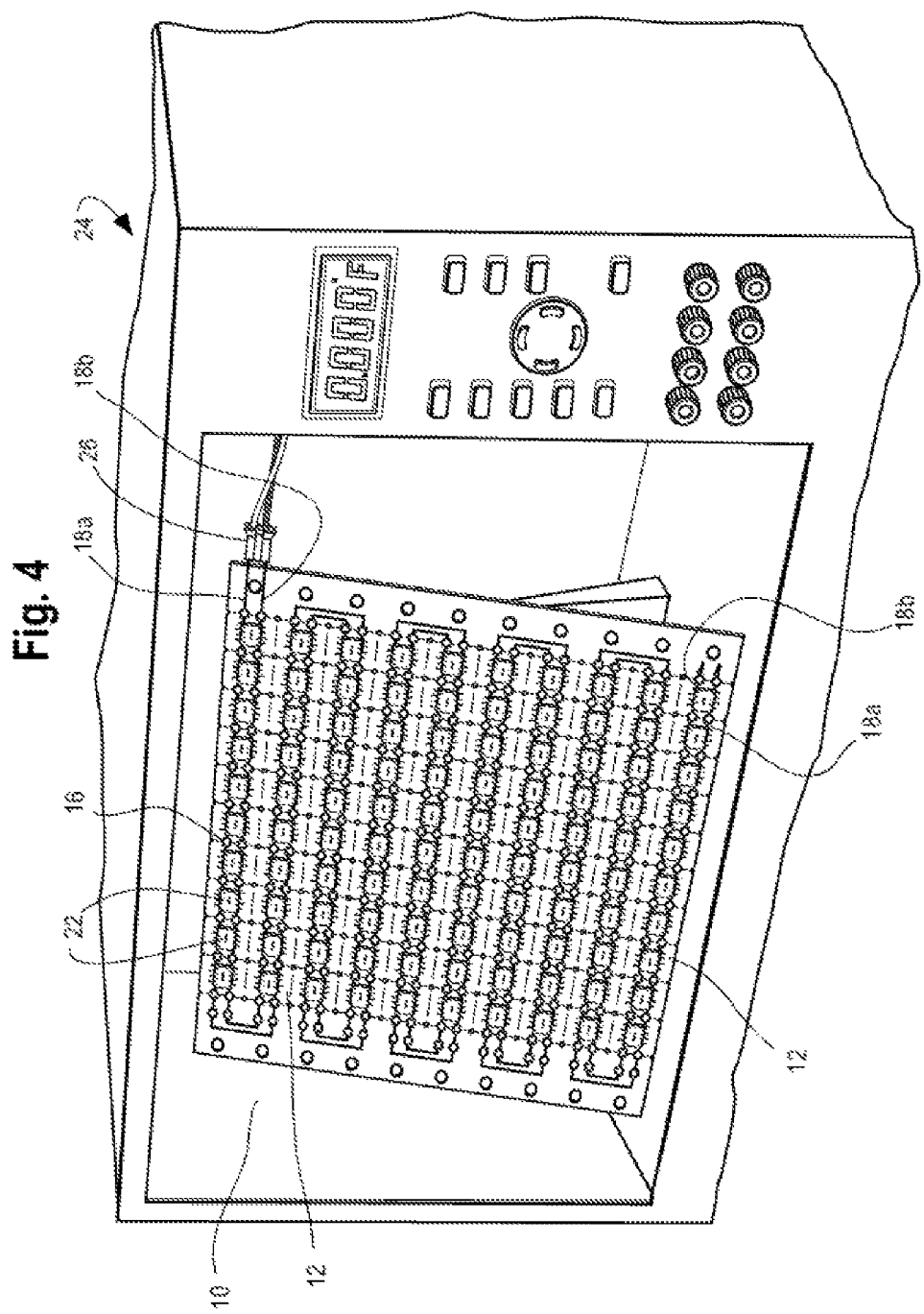

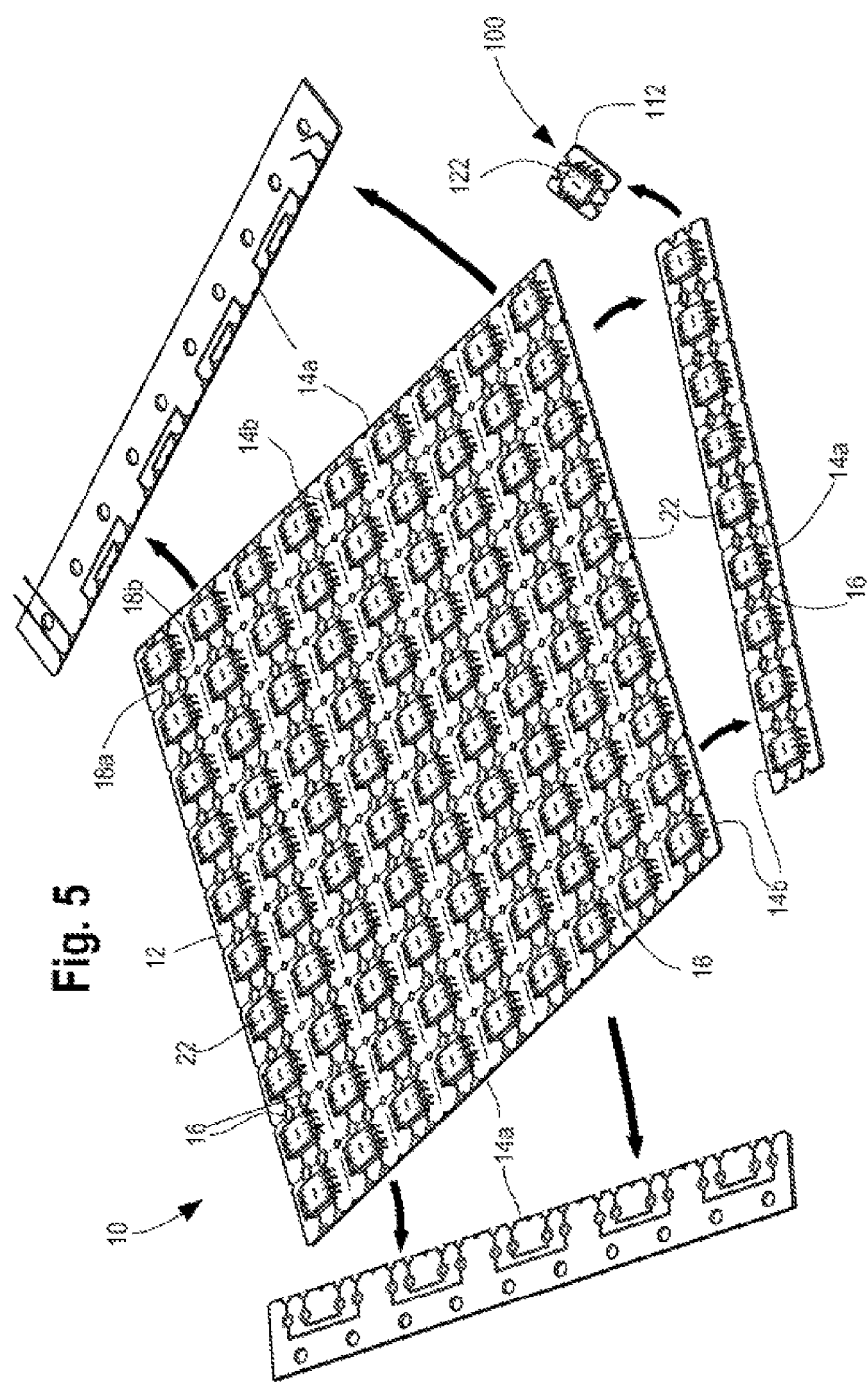

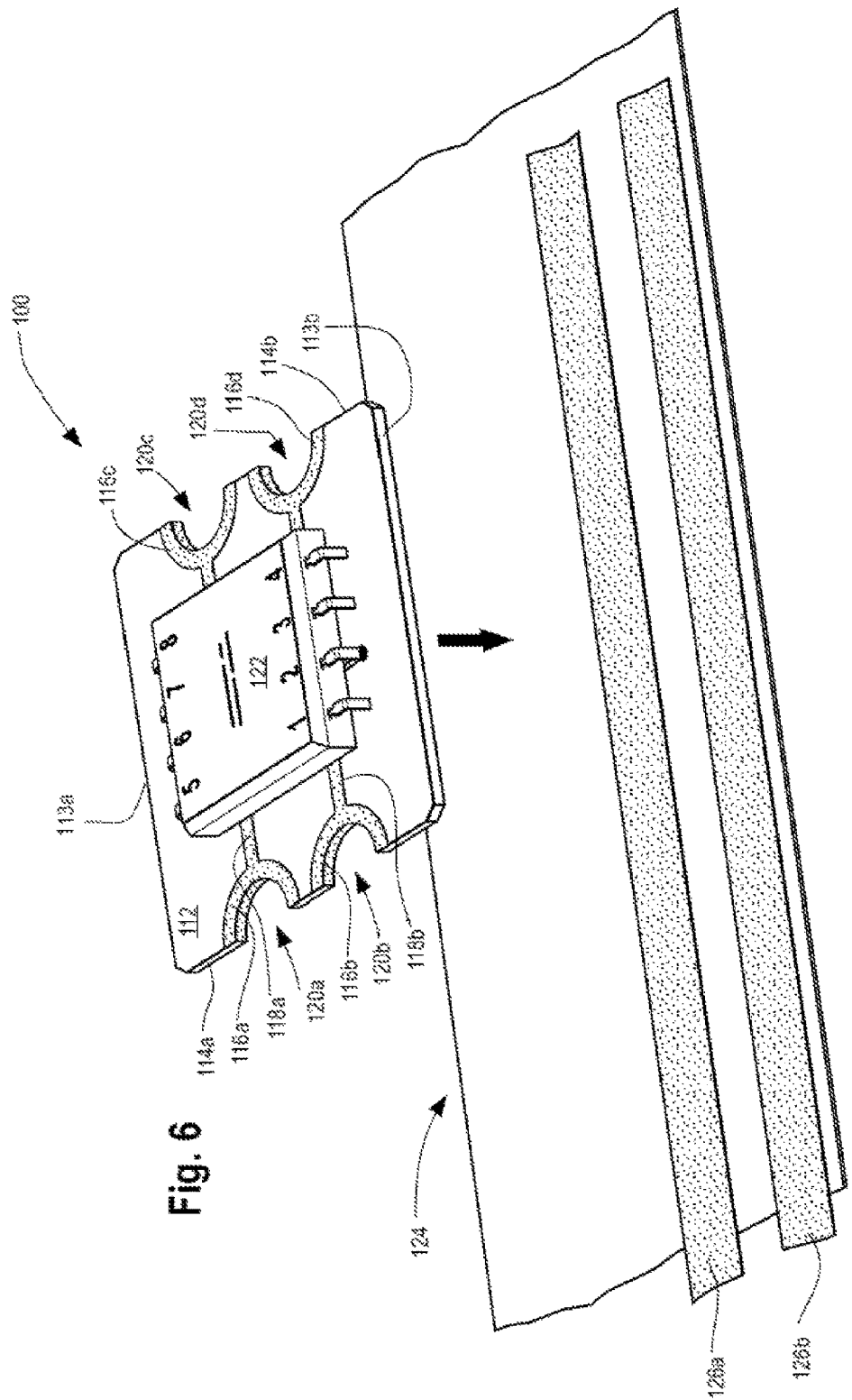

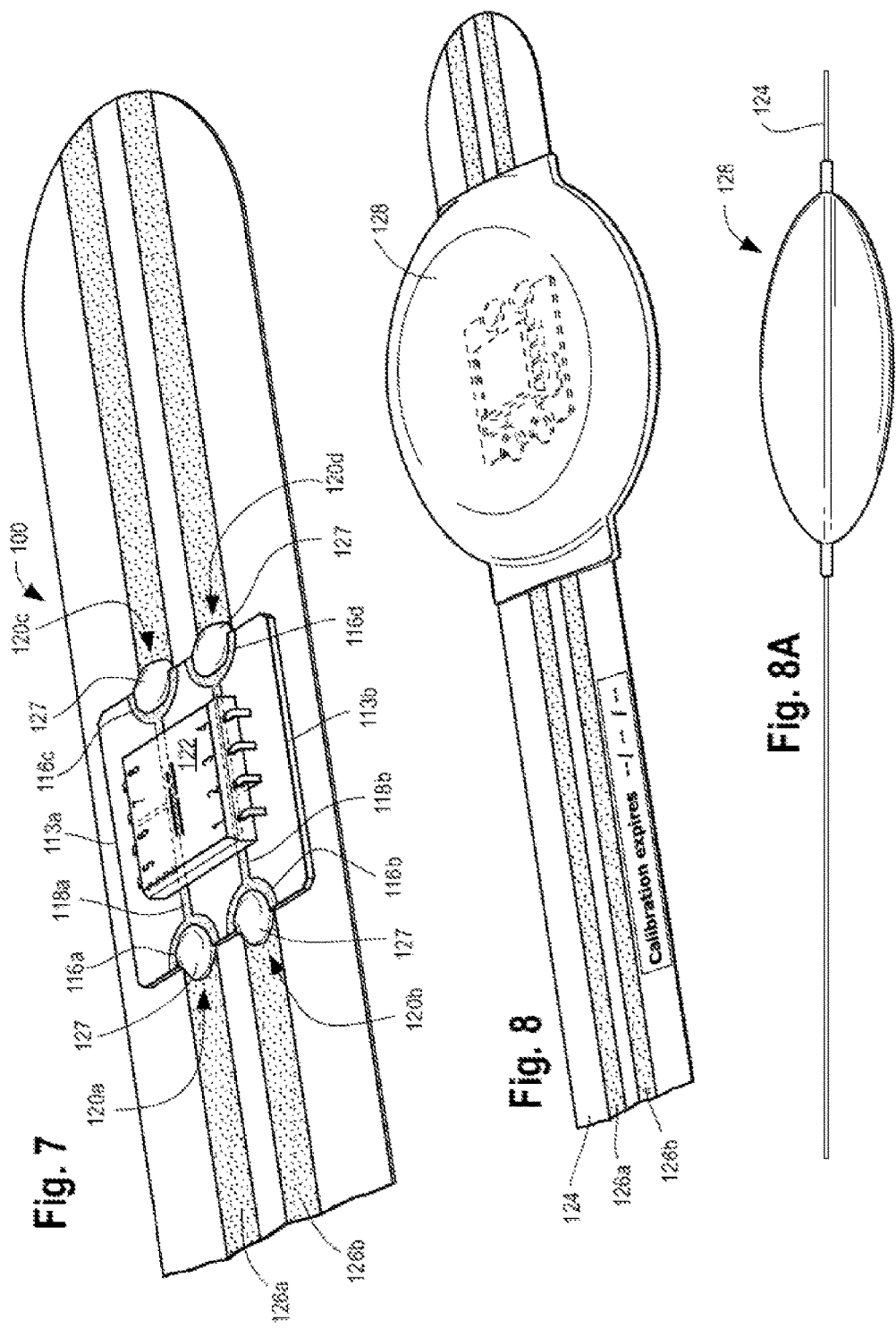

SENSOR MODULE AND PROCESS FOR PRODUCING SAME

The present disclosure relates to sensing equipment and a process for producing and calibrating sensing equipment.

BACKGROUND

Known are sensing devices and recording devices for detecting environmental conditions such as temperature, pressure, and humidity. A sensor module typically detects a target environmental condition real time (i.e., temperature) and sends the data to a recording device. The sensor module and recording device assembly is typically referred to as a "data logger" or "a logger." Temperature loggers, for example, are used to monitor temperature for storage containers and transportation containers in the healthcare industry and in the food industry. A temperature logger stores and/or transmits the temperature data to a processing unit or a controller for analysis, trending, monitoring and/or adjustment of the temperature in a storage container, such as a refrigerator, for example.

Calibration of the logger and/or the individual sensor module is required to reduce error and to ensure that the readings taken by the sensor module are accurate. Calibration to achieve accurate measurements is costly and time consuming. Calibration for a temperature sensor module, for example, typically requires comparing a sensed temperature value to a reference value from a reference thermometer, and adjusting the sensor module so that the sensed value is within a specified tolerance. This process is repeated at several different temperature values several times to ensure that the accuracy is verifiable and repeatable.

The highest level of accuracy assurance is provided by calibration performed in an International Organization for Standardization/International Electrotechnical Commission 17025 accredited or "ISO 17025" accredited laboratory. An "ISO 17025" certified device receives a calibration certificate presenting the details of the calibration tests and results for each device tested. The calibration certificate is generally valid for 12 months, after which time the device is required to be re-calibrated. On the re-calibration date, the sensor module and its supporting logger must be taken out of service and re-calibrated as a whole, which results in downtime of the equipment being monitored as well as considerable cost for each annual calibration. The high cost of calibration for sensor modules and loggers has resulted in low rates of adoption of improved quality assurance, even in industries where loggers are required for regulatory compliance.

Typical production of conventional sensor modules does not entail calibration, let alone calibration to the ISO 17025 standard. As such, conventional temperature loggers are subject to the pre-use requirement of calibration—and the cost and time impediments associated therewith—prior to being deemed "ready-for-use." Further compounding the ready-for-use requirements for loggers, the number of devices requiring calibration continues to increase worldwide due to stricter regulatory requirements in the food/healthcare industries, such as the stricter regulatory requirements in the US Food Safety Modernization Act of 2011.

The art recognizes the need for cost-effective and time-efficient processes for the production and calibration of sensor modules than is presently available.

SUMMARY

The present disclosure provides a combined fabrication and calibration process for sensor modules and temperature sensor modules in particular. The present disclosure also provides the completed calibrated sensor module and an electronic device containing the calibrated sensor module.

The present disclosure provides a process. In an embodiment, the process includes providing a substrate. The substrate includes (i) a plurality of panels, (ii) at least two continuous traces extending along the substrate and along each panel, and (iii) a sensor chip mounted on each respective panel. Each sensor chip is in electrical connection with the traces. The process also includes placing the substrate in a test apparatus under test conditions and connecting a data collection apparatus (DCA) to the traces. The process also includes transmitting, from the DCA, a signal to each sensor chip and receiving, by the controller, a sensor value from each sensor chip. The process also includes comparing with the controller, the sensor value from each sensor chip to a reference value.

The present disclosure provides a sensor module. In an embodiment, the sensor module includes a panel comprising a pair of opposing sides and a pair of opposing edges. The sensor module includes at least two continuous traces extending along the panel. Each trace has opposing ends. Each trace end has an exposed area at each edge. The sensor module also includes a sensor chip. The sensor chip is electrically connected to each trace.

The present disclosure provides an electronic device. In an embodiment, the electronic device includes a substrate, an electrical component electrically connected to the substrate, and the sensor module electrically connected to the substrate.

An advantage of the present disclosure is a production process that simultaneously fabricates and calibrates a finished temperature sensor module that is pre-calibrated upon delivery to the customer.

An advantage of the present disclosure is a more time-efficient and more cost-efficient production and calibration process than heretofore known.

BRIEF DESCRIPTION OF THE DRAWINGS

FIG. 2 is a perspective view of the substrate of FIG. 1.

FIG. 2A is an enlarged perspective view of area 2A of FIG. 2.

FIG. 2B is an elevational view taken along line 2B-2B of FIG. 2A.

FIG. 4 is a perspective view of the substrate of FIG. 3 located in a test apparatus in accordance with an embodiment of the present disclosure.

FIG. 5 is a perspective view of the substrate being singulated in accordance with an embodiment of the present disclosure.

FIG. 6 is a perspective view of a sensor module being attached to a flat flexible cable in accordance with an embodiment of the present disclosure.

FIG. 7 is a perspective view of the sensor module electrically connected to the flat flexible cable in accordance with an embodiment of the present disclosure.

FIG. 8 is a perspective view a sensor unit in accordance with an embodiment of the present disclosure.

FIG. 8A is an elevation view of the sensor unit of FIG. 8.

DETAILED DESCRIPTION

Definitions

Figure 1:
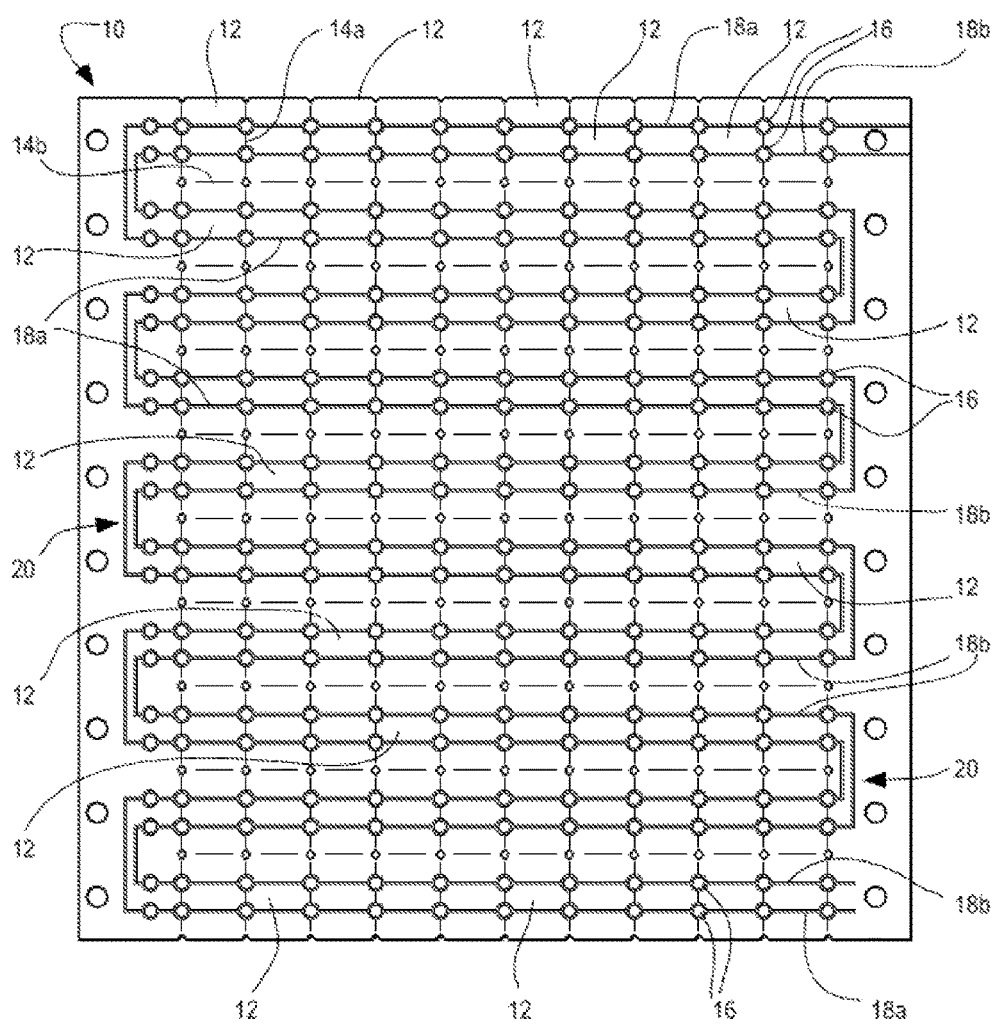
FIG. 1 is a top plan view of a substrate in accordance with an embodiment of the present disclosure.

The terms "comprising," "including," "having," and their derivatives, are not intended to exclude the presence of any additional element, component, step or procedure, whether or not the same is specifically disclosed. In contrast, the term, "consisting essentially of" excludes from the scope of any succeeding recitation any other element, component, step or procedure, excepting those that are not essential to operability. The term "consisting of" excludes any element, component, step, or procedure not specifically delineated or listed.

A "computing device" (or "a computer readable device") is a non-transitory computing device with a central processing unit (CPU), random access memory (RAM), and a storage medium (such as hard disk drive, solid state drive, flash memory, cloud storage. Nonlimiting examples of computing devices include personal computers (PCs), smart phones, laptops, mobile computing devices, tablet PCs, and servers. The term "computing device" may also describe two or more computing devices communicatively linked in a manner as to distribute and share one or more resources, such as clustered computing devices and server banks/farms. It is understood that any number of computing devices could be used, and embodiments of the present disclosure are contemplated for use with any computing device.

The term "electrical connection" or "electrically connected" is the ability to allow the flow of electrons between two or more components. Electrical connection is the flow of an electrical current between two points.

A "flat flexible cable," or "FFC," is an electrical cable composed of multiple metal conductors (2 or more) sandwiched between two layers of insulation material, such as polymeric material, for example. The ends and/or sections of the metal conductors are exposed for connectivity capability. Each end of the flat flexible cable may be reinforced with a stiffener to make insertion easier or to provide strain relief.

The "Internet" refers to interconnected (public and/or private) networks that may be linked together by protocols (such as TCP/IP and HTTP) to form a globally accessible distributed network. While the term Internet refers to what is currently known (e.g., a publicly accessible distributed network), it also encompasses variations which may be made in the future, including new protocols or any changes or additions to existing protocols.

A "pad" is a portion of exposed metal on the surface of a printed circuit board to which a component is soldered.

A "panel" is a portion (or a sub-portion) of a printed circuit board that is made to be singulated, or has been singulated, from the printed circuit board.

A "plated through hole" is a hole on a printed circuit board which has an annular ring and which is plated all the way through the printed circuit board.

A "printed circuit board" (or "PCB") is a board that has lines and pads that connect various points together. A printed circuit board includes traces that electrically connect the various connectors and components to each other. A printed circuit board allows signals and power to be routed between physical devices. Solder is the metal that makes the electrical connections between the surface of the PCB and the electronic components. Being metal, solder also serves as a strong mechanical adhesive. PCB includes at least one layer of conductive material and at least one layer of insulative material. It is understood that PCB may have two or more layers of alternating conductive material and insulative material.

A "sensor chip" is an integrated circuit (IC) composed of a semiconductor wafer on which one or more tiny resistors, capacitors, and transistors are fabricated. The sensor chip includes logic that is programmable for sensing a condition such as temperature, moisture, pressure, sound, vibration, motion, and/or the presence of a chemical. The IC may include semiconductor diodes that have condition-sensitive voltage vs. current characteristics to sense one or more of the aforementioned conditions. The IC may also include logic to function as an amplifier, oscillator, timer, counter, computer memory, or microprocessor. A "digital temperature sensor chip" is a sensor chip with a digital IC—as opposed to an analog IC. The term "digital" refers to electronic technology that generates, stores, and processes data in terms of two states: positive and non-positive. Positive is expressed or represented by the number 1 and non-positive by the number 0. Thus, data transmitted or stored with digital technology is expressed as a string of 0's and 1's. Each of these state digits is referred to as a bit (and a string of bits that a computer can address individually as a group is a byte). Digital excludes analog technology, which conveys data as electronic signals of varying frequency or amplitude that are added to carrier waves of a given frequency. The digital temperature sensor chip includes logic for sensing temperature.

A "score line" is a partial cut through of a PCB, allowing the PCB board to be readily singulated along a line. Before singulation, the PCB is typically a uniform substrate, the substrate having the ability of being singulated into discrete subcomponents.

A "server" is a computer program that provides services to other computer programs (and their users) in the same or other computing devices. The computing device that a server program runs in is also frequently referred to as a server (though it may be used for other purposes as well). Specific to the Web, a Web server is the computer program (housed in a computing device) that serves requested HTML pages or files. A Web client is the requesting program associated with the user. For example, the Web browser in a home PC is a client that requests HTML files from a Web server.

"Singulation" or "singulating" refers to a process step in PCB manufacturing. PCBs are often designed so that they consist of many smaller individual PCBs, or "panels," that will be used in the final product. Singulation is the art of breaking up, or depaneling, a large PCB into small panels.

"Surface mount" is a construction method which allows electric components to be simply set on a PCB, not requiring that leads pass through holes in the board.

A "through-hole" is a hole in a PCB used to pass a signal from one layer to another.

A "trace" is a continuous path of a conductive material, typically a metal. A nonlimiting example of a trace is a continuous path of copper on a surface of a PCB.

A "web site" refers to a system that serves content over a network using the protocols of the World Wide Web. A web site may correspond to an Internet domain name, and may serve content associated or provided by an organization. The term may encompass (i) the hardware/software server components that serve objects and/or content over a network, and/or (ii) the "backend" hardware/software components, including any standard, non-standard or specialized components, that may interact with the server components that provide services for Web site users.

"Wireless communication" is one or more wireless technologies such as Near Field Communications (NFC), Wi-Fi, infrared, Bluetooth, or one or more variants of wireless cellular technology.

The "World Wide Web" (or "Web") refers to (i) a distributed collection of user-viewable or accessible documents (that may be referred to as Web documents or Web pages) or objects that may be accessible via a publicly accessible distributed network like the Internet, and/or (ii) the client and server software components which provide user access to documents and objects using communication protocols. A protocol that may be used to locate, deliver, or acquire Web documents or objects through HTTP (or other protocols), and the Web pages may be encoded using HTML, tags, and/or scripts. The terms "Web" and "World Wide Web" encompass other languages and transport protocols including or in addition to HTML and HTTP that may include security features, server-side, and/or client-side scripting.

The numerical ranges disclosed herein include all values from, and including, the lower value and the upper value. For ranges containing explicit values (e.g., 1 or 2, or 3 to 5, or 6, or 7) any subrange between any two explicit values is included (e.g., 1 to 2; 2 to 6; 5 to 7; 3 to 7; 5 to 6; etc.).

1. Process

The present disclosure provides a process. In an embodiment, the process includes providing a substrate. The substrate includes (i) plurality of panels, (ii) at least two continuous traces extending along the substrate and along each panel, and (iii) a sensor chip mounted on each respective panel. Each sensor chip is in electrical connection with the traces. The process includes placing the substrate in a test apparatus under test conditions. The process includes connecting a data collection apparatus to the traces. The process includes transmitting, from the data collection apparatus, a signal to each sensor chip, and receiving, by the data collection apparatus, a sensor value from each sensor chip. The process includes comparing with the data collection apparatus, the sensor value from each sensor chip to a reference value.

2. Substrate

The process includes providing a substrate. The substrate includes a plurality of panels. In other words, the substrate has at least two panels. The panels are separated by one or more lines of delineation. The lines of delineation may be physical demarcations (such as score lines, for example) present upon the substrate surface. Alternatively, the lines of delineation may be part of the internal design of the substrate, the lines of delineation not visible. The lines of delineation guide the singulation (either manual or automated) of the panels from the substrate.

The substrate can be a thick film hybrid, a thin film hybrid, a printed circuit board, or a flexible circuit board. In an embodiment, the substrate is a printed circuit board, or PCB. The PCB includes a multi-layer laminate material. Nonlimiting techniques for PCB fabrication include photolithographic process, etching process, laser scanning and test process, lamination process, machining, and a finishing process consisting of scoring, drilling, plating, blanking, and routing.

Figure 2C:
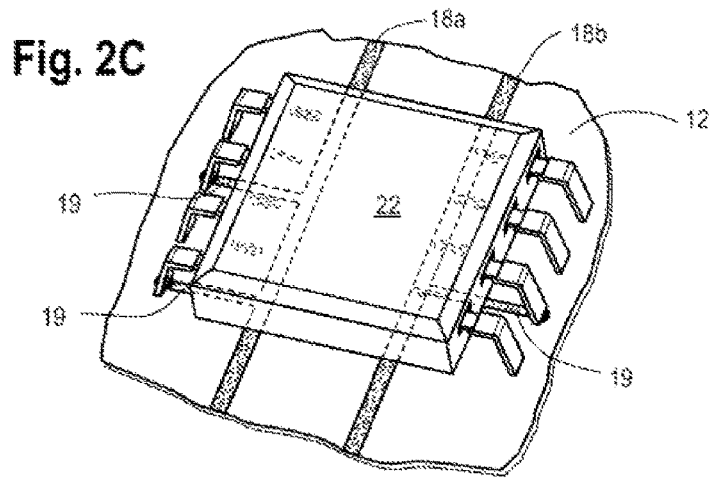
FIG. 2C is an enlarged perspective view of a panel in accordance with an embodiment of the present disclosure.
Figure 3:
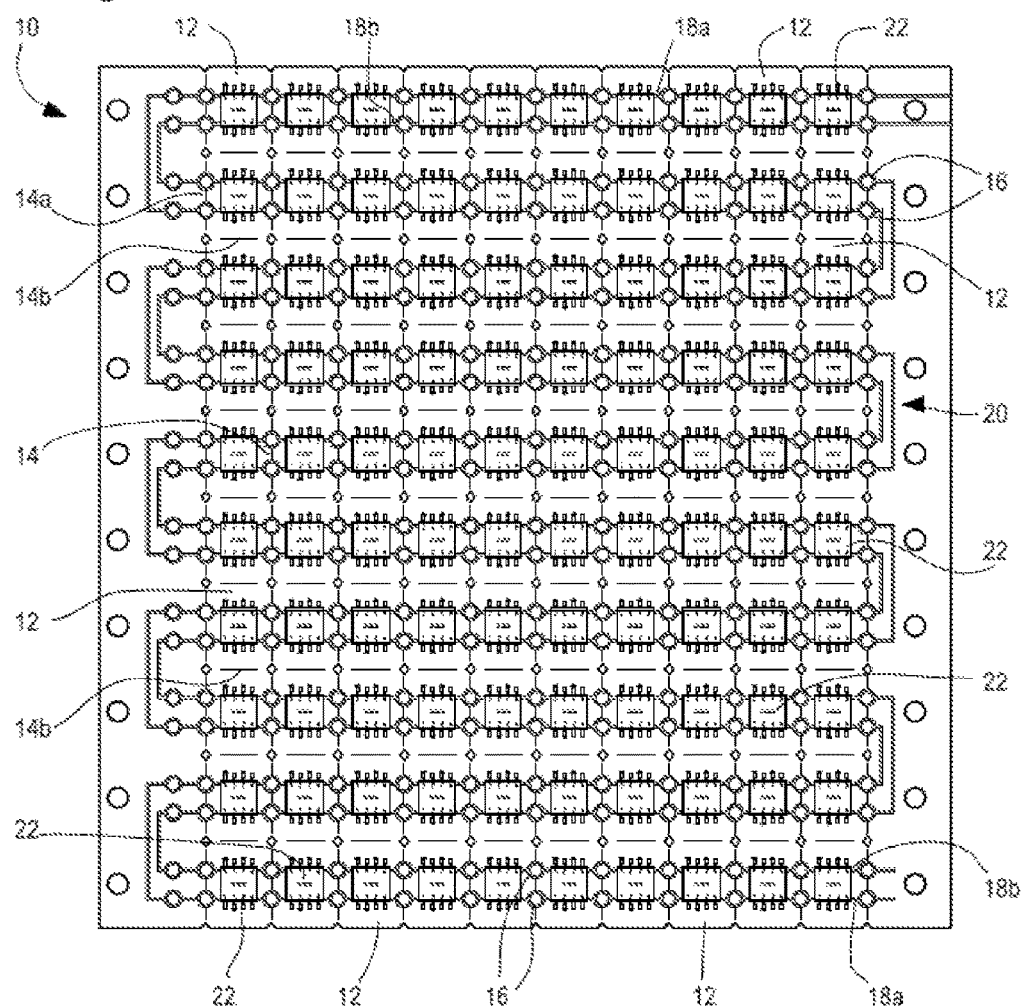
FIG. 3 is a top plan view of the substrate of FIG. 1 with sensor chips mounted thereon in accordance with an embodiment of the present disclosure.

In an embodiment, the substrate is a printed circuit board 10, or "PCB" 10 as shown in FIGS. 1-3. PCB 10 can be any PCB as disclosed above. A plurality of interconnected panels 12 form the PCB 10. Each panel may or may not include exposed metal on one or more surfaces of the PCB. The panels of the PCB may be arranged in a single row. Alternatively, the PCB 10 may include an array of multiple rows of panels 12 as shown in FIGS. 1-3. The array of panels 12 result in a PCB substrate having a polygonal shape. The array of multiple panels give the PCB a polygonal shape, such as a square shape or a rectangular shape, for example.

The PCB 10 may have from 2, or 3, or 4, or 5, or 6, or 7, or 8, or 9, or 10, or 20, or 30, or 50, or 100, or 180 to 200, or 250, or 300, or 500, or 700, or 1000, or more panels 12. In an embodiment, the PCB 10 includes multiple rows of panels such as a 10×10 array of panels 12, or 100 panels 12, as shown in FIGS. 1-3. It is understood that the substrate may be configured to include more than or less than individual 100 panels.

In an embodiment the PCB 10 has from 2, or 3, or 4, or 5, or 6, or 7, or 8, or 9, or 10, or 20, or 30, or 50, or 100, or 180 to 200, or 250, or 275, or 300 panels 12.

In an embodiment, the lines of delineation between the panels are one or more score lines. The panels are connected to each other and the panels 12 are separated by, or are otherwise defined by, score lines 14a, 14b. The score lines 14a, 14b delineate each panel from each other panel. The score lines 14a, 14b can be (i) tab-routed score lines, (ii) v-score lines, and (iii) a combination of (i) and (ii).

Upon singulation, the score lines 14a will define panel edges, and the score lines 14b will define panel sides as will be discussed in detail below.

In an embodiment, the PCB 10 includes through-hole pairs 16 as shown in FIGS. 1-3. The through-hole pairs 16 are arranged in a spaced-apart manner on the PCB 10. Each panel 12 is bounded by two through-hole pairs 16. In an embodiment, the score lines 14a are v-score lines which traverse the through-hole pairs 16 as best shown in FIGS. 2A and 2B. In this way, the through hole pairs 16 contribute, along with the score lines 14a, 14b, to delineate, or otherwise define, the area of each panel 12.

3. Traces

At least two continuous traces extend along the substrate. The traces do not intersect. The term "traces extending along," denotes (i) traces extending on one (and optionally both) exposed surface(s) of the substrate, (ii) traces extending along an interior (buried in a non-exposed layer) layer of the substrate, and (iii) a combination of (i) and (ii). The traces may or may not be parallel with respect to each other. The substrate may include from 2, or 3 to 4, or 5, or 6 traces. Each trace extends along the substrate so as to traverse each panel. In this way, each trace places each panel in electrical connection with every other panel. If the substrate includes three traces, for example, then each panel is electrically connected to each other panel by way of three traces. The electrical connection can be (i) in series, (ii) in parallel, or (iii) a combination of (i) and (ii).

In an embodiment, PCB 10 as the substrate, includes two traces, trace 18a and trace 18b extending along an exterior surface of the PCB as shown in FIGS. 1-3. As shown in FIG. 2C, the surface traces 18a, 18b form a pad for each panel 12. Each trace 18a, 18b extends along the PCB 10 in a serpentine pathway to electrically connect each panel with every other panel in the 10×10 array. FIGS. 1-3 show trace 18a parallel, or substantially parallel, with respect to trace 18b.

In an embodiment, one of trace 18a, 18b is a signal line and the other trace 18a, 18b is a ground line.

4. Sensor Chip

The substrate includes one or more sensor chips mounted on each respective panel. The sensor chip is in electrical connection with each trace. Nonlimiting examples of suitable sensor chips include a pressure sensor chip, a humidity sensor chip, an optical sensor chip, a temperature sensor chip, and combinations thereof.

In an embodiment, the substrate has from 2, or 3, or 4, or 5, or 5, or 7, or 8, or 9, or 10, or 20, or 30, or 50, or 100, or 180 to 200, or 250, or 300, or 500, or 700, or 1000, or more sensor chips.

In an embodiment, the PCB 10 includes multiple rows of panels such as a 10×10 array of panels 12, or 100 panels 12, as shown in FIGS. 1-3. It is understood that the substrate may be configured to include more than or less than individual 100 panels.

In an embodiment the PCB 10 has a single sensor chip on each panel. The PCB 10 has from 2, or 3, or 4, or 5, or 6, or 7, or 8, or 9, or 10, or 20, or 30, or 50, or 100, or 180 to 200, or 250, or 275, or 300 panels 12, and the same number of sensor chips.

In an embodiment, the sensor chip is a digital temperature sensor chip 22 (or DTSC 22) as shown in FIGS. 2-7. Each DTSC 22 is electrically connected to each trace 18a, 18b by way of conductive tracks 19 shown in FIG. 2C.

In an embodiment, the DTSC 22 has a temperature range from 55° C. to 150° C. (−58 to 302° F.). A nonlimiting example of a suitable digital temperature sensor chip for DTSC 22 includes the DS18B20 one wire digital temperature sensor, available from Maxim Integrated.

It is understood that other electrical components may be mounted on (or in) each panel. The additional components may be in electrical connection with the sensor chip. Nonlimiting examples of other electrical components that may be mounted on the panels include antenna, application specific integrated circuit (ASIC), capacitor, diode, optoelectronic device, transducer, transistor, switch, resistor, and any combination thereof.

5. Test Apparatus

The process includes placing the substrate in a test apparatus and connecting data collection apparatus to the substrate. The connection between the substrate and the data collection apparatus may be a wire electrical connection, or a wireless connection between the data collection apparatus and the traces. Connection to the traces can occur before entry into the test apparatus or after the substrate is placed in the test apparatus. The connection between the substrate and the data collection apparatus places the data collection apparatus in operative communication with the traces and in operative communication with each sensor chip.

With the substrate placed in the test apparatus, the test apparatus is subsequently subjected to test conditions. The term "test conditions," as used herein, is a controlled environmental condition producing a pre-determined condition, parameter, and/or property detected by a reference sensor. The test condition may also be a protocol entailing a series of predetermined and controlled and/or predetermined conditions or parameters. For example, the test conditions will yield a predetermined temperature (0° C.), the predetermined temperature verified with a reference thermometer operatively connected to the data collection apparatus.

In an embodiment, the substrate is placed under test conditions in a laboratory that is accredited to ISO 17025.

A "data collection apparatus," or "DCA," as used herein, is a computing device with input and output connections capable of (i) collecting data from the reference sensor, (ii) two-way communication with the test apparatus, and (iii) storing data from the DSTCs. Nonlimiting examples of suitable suitable DCAs include a programmable logic controller (PLC), a personal computer (laptop or desktop), and combinations thereof.

In an embodiment, the PCB 10 is placed in a test apparatus that is a testing chamber 24 as shown in FIG. 4. An electrical conduit, such as a wire 26, electrically connects the traces 18a, 18b to the DCA (not shown). The test chamber 24 includes a reference thermometer (not shown). The DCA interfaces with the test chamber (and the reference thermometer), sending instructions to set the test conditions.

In an embodiment, the DCA is a computing device with tailored input and output for operatively connecting with the test apparatus.

The DCA is in operative communication with the test chamber. The DCA subsequently sets test conditions. The calibration process operates by connecting the DCA to both the (i) test chamber and (ii) to the substrate (vis-à-vis the traces). In this way, the DCA is able to control the conditions (i.e., temperature) in the test chamber while simultaneously measuring the output of each DTSC 22. The DCA adjusts settings to ensure the appropriate test condition is obtained. Once the DCA determines that the test condition is obtained, the test apparatus and DCA are ready to take readings and received data from the substrate.

In an embodiment, each DTSC 22 is calibrated by comparison of its reading with a reading from the reference thermometer. The reference temperature may be a known physical constant, or it may be provided by a certified thermometer. The certified thermometer may be checked against several reference points and corrections may apply at each point.

Nonlimiting examples of suitable physical constants/reference points include (i) an ice slurry, which is an approximation of 0° C.; triple points of various substances (e.g., the triple point of water in a vacuum is 0.0100° C.; the triple point of mercury is −38.8344° C.; the triple point of Indium is 156.5945° C.); and baths of various combinations, such as a dry ice and ethanol bath for the reference of −72° C.

The process includes transmitting one or more signals, from the DCA, to each sensor chip. In an embodiment, the DCA sends a query signal (a "call"), requesting the identity of each DTSC 22. In response, the DCA then receives an address identifier from each DTSC 22. The DCA logs, or otherwise stores each sensor chip address in memory.

The DCA subsequently receives a sensor value from each sensor chip. The DCA then compares the sensor value from each sensor chip to a reference value provided by the reference sensor.

In an embodiment, the reference thermometer in the test chamber 24 provides the reference temperature to the DCA. The DCA receives the sensor output (i.e., detected temperature value) for each DTSC 22 present in the test chamber 24. The DCA then compares the sensed value (from each sensor chip) to the reference value (from the reference thermometer). The DCA stores this data in memory categorized and/or recorded by the unique identification number (sensor address) for each DTSC 22 as an "As Found" reading. An "As Found-raw" reading refers to the uncorrected reading obtained from sensor before any adjustment. An "As Found-corrected" reading is the reading derived from the DTSC 22 raw value and any correction values stored in the DTSC 22. Correction is performed by the DCA using a formula when the data is made human readable. "As Found-corrected" data is stored in the DCA when correction values are generated.

The output of the sensor chip is evaluated to determine if the output is within a certain tolerance of a pre-determined target output. If not, it is then determined if the output can be corrected by programming the sensor chip. If the output can be corrected, then the sensor chip is programmed to produce the target output. Thereafter, the above steps can be repeated (i) for a variety of different conditions and (ii) for each sensor chip on the substrate.

In an embodiment, the DCA evaluates the sensor value to determine whether the sensor value is within a certain tolerance of a predetermined (or target) value.

An "As Left-raw" reading is an uncorrected reading from the DTSC 22 after adjustment of the DTSC 22 characteristics during the calibration process. The "As Left-raw" reading is recorded and stored in the DCA if adjustments are made to the DTSC characteristics during the calibration process.

An "As Left-corrected" reading is a reading derived after adjustment of either the DTSC characteristics or the stored correction values during the calibration process. An "As Left-corrected" reading is recorded and stored in the DCA if any correction values and/or adjustments are made to either the DTSC characteristics or to the stored correction values.

In an embodiment, the process includes performing the comparing step for each sensor chip while the substrate is in the test chamber under test conditions. The comparing step is performed with the PCB 10 intact (non-singulated), the PCB 10 composed of a plurality of the panels 12.

Bounded by no particular theory, Applicant discovered a process whereby sensor chips can be calibrated en masse and subsequently fabricated into a finished sensor module, the sensor module being pre-calibrated in compliance with testing standards/protocol (such as ISO 17025, for example) when delivered to an end user. In this way, Applicant's process pre-calibrates, or otherwise calibrates prior to fabrication, the sensor chip. The sensor chip has a unique identification number (a unique address) and therefore each sensor chip is identifiable by the DCA. In other words, Applicant's process calibrates many sensor chips simultaneously, or substantially simultaneously, because the sensor chips are electrically connected to each other (vis-à-vis the traces) while being subjected to the same test conditions at the same time. Each sensor chip is read, identified, evaluated, and calibrated individually, vis-à-vis the traces and the DCA, while each sensor chip is a component of the same substrate, PCB 10.

6. Singulation

In an embodiment, the process includes separating the panels from the substrate as shown in FIG. 5. The separation is accomplished by way of singulation along the lines of delineation. Singulation may be performed manually or by way of automated singulation. Nonlimiting examples of automated singulation include press-based systems, punch die systems, laser-cutting systems, automatic computer numeric control routing, automatic shuttle table models, and any combination thereof. The die can be pneumatic, hydraulic, and a combination thereof.

In an embodiment, singulation occurs along score lines 14*a* and 14*b* to remove each panel 12 from the PCB 10. Automated singulation occurs along score lines 14*a* and 14*b* to remove each panel 12 from the PCB 10.

7. Sensor Module

Once singulated from the substrate, each panel forms a sensor module. The sensor module includes a panel having a pair of opposing sides, the panel also having a pair of opposing edges. The panel includes at least two continuous traces extending between the opposing edges. Each trace has an exposed area at each respective edge. The sensor module includes a sensor chip electrically connected to each trace.

In an embodiment, a sensor module 100 is shown in FIGS. 5-6. FIG. 5 illustrates that once a panel 12 of PCB 10 is singulated, a sensor module 100 is formed. The sensor module 100 includes a panel 112. The panel 112 corresponds to the panel 12 of the substrate 10. The panel 112 includes a first side 113*a* and an opposing second side 113*b*. The sensor module 100 includes a first edge 114*a*, and an opposing second edge 114*b*.

In an embodiment, the panel 112 is formed from a PCB substrate composed of through-hole pairs as previously disclosed. Consequently, after singulation, each edge 114*a*, 114*b* includes a pair of through-hole halves (hereafter "THHs"). Edge 114*a* includes THHs 116*a*, 116*b*. Edge 114*b* includes THHs 116*c*, 116*d*.

The panel 112 includes a first trace 118*a* and a second trace 118*b*. The traces 118*a*, 118*b* correspond to the traces 18*a*, 18*b* of the substrate PCB 10. Each trace 118*a*, 118*b* traverses the length of the panel 112 such that each trace has an exposed end at each edge 114*a*, 114*b*. The trace 118*a* has exposed ends 120*a*, 120*c* at respective edges 114*a* and 114*b*. The trace 118*b* has exposed ends 120*b*, 120*d* at respective edges 114*a* and 114*b*. The exposed ends (120, 120*b*) of trace 118*a* do not contact the exposed ends (120*c*, 120*d*) of trace 118*b*.

The sensor module 100 includes a sensor chip 122, such as digital temperature sensor chip (DTSC) 122. DTSC 122 corresponds to (is the same as) the DTSC 22 of the substrate PCB 10.

The exposed ends 120*a*-120*d*, may or may not include THHs. In the event the panel 112 is fabricated from a substrate that did not include through-holes, the exposed ends 120*a*-120*d* will not have THHs. Similarly, if the panel 112 is fabricated from a substrate with through-holes and singulation splits the through-holes, the exposed ends 120-120*d* will include THHs 116*a*-116*d*.

The exposed ends 120-120*d* of the traces 118*a*, 118*b* include conductive material. As shown in FIG. 2B, conductive material 21 extends from the top surface of the panel 12 to the bottom surface of the panel. The conductive material may or may not extend to conductive undersegments 21*a*, located on the panel surface opposite the DTSC 22. Conductive material 21 provides electrical connection from the DTSC 22, to the traces 18*a*, 18*b*, and to the exposed edges after singulation occurs. Consequently the panel 122 (formed from the panel 12 by way of singulation) will have conductive material that extends from the top surface of the panel to the bottom surface of the panel; the panel 122 providing electrical connection between the DTSC 122 and each exposed end 120*a*-120*d*.

The sensor module 100 may include additional electronic components. The additional electronic component(s) may be any additional electronic component as disclosed above.

In an embodiment, the DTSC 122 has an address (i.e., a unique identification number). Within the logic of the integrated circuit for the DTSC 122 evidence of calibration is present. Evidence that DTSC 122 has been calibrated (or is a calibrated DTSC) may include one, some, or all of the following features (i)-(iii) below:

(i) correction data stored in the DTSC; and/or (ii) consistently higher performance of a sample set of DTSCs when compared with another sample set of known-to-be un-calibrated DTSCs from the same manufacturer with the same model number and specification; and/or (iii) the presence of a calibration certificate with the device serial number.

In an embodiment, the sensor module 100 may be integrated into an electronic device. In other words, the sensor module 100 may be a component of a larger electronic device.

In an embodiment, the sensor module 100 is attached to a cable. Nonlimiting examples of suitable cable include coaxial cable, ribbon cable, telephone cable, insulated twisted pair cable, category 5 (Cat5, or Ethernet) cable, and flat flexible cable.

In an embodiment, the sensor module 100 is attached to a flat flexible cable 124 (or "FFC") as shown in FIGS. 6-8. The bottom side of the panel 122 is placed on the FFC 124. One, some, or all exposed edges 120a-120d are electrically connected to one or both conductors 126a, 126b of the FFC 124. Attachment may occur by way of conductive material 127 shown in FIG. 7. Nonlimiting examples of suitable material for conductive material 127 include solder, conductive glue, conductive adhesive (such as conductive tape), and combinations thereof.

The sensor module 100, and optionally a portion of the FFC 124, may be covered by a protective material 128 as shown in FIGS. 8 and 8A. The protective material 128 may be glass, metal, wood, a polymeric material, and combinations thereof. In an embodiment, the protective material 128 is polymeric material that fully encapsulates, and protects, the sensor module 100, and also encapsulates a portion of the FFC 124 as shown in FIGS. 8 and 8A.

The sensor module 100 in electrical connection with the FFC 124 forms a sensor unit 130. The sensor unit can be attached to a storage device. Nonlimiting examples of storage devices include autoclave, cryogenic storage device, incubator, refrigerator, freezer, and combinations thereof.

Figure 9:
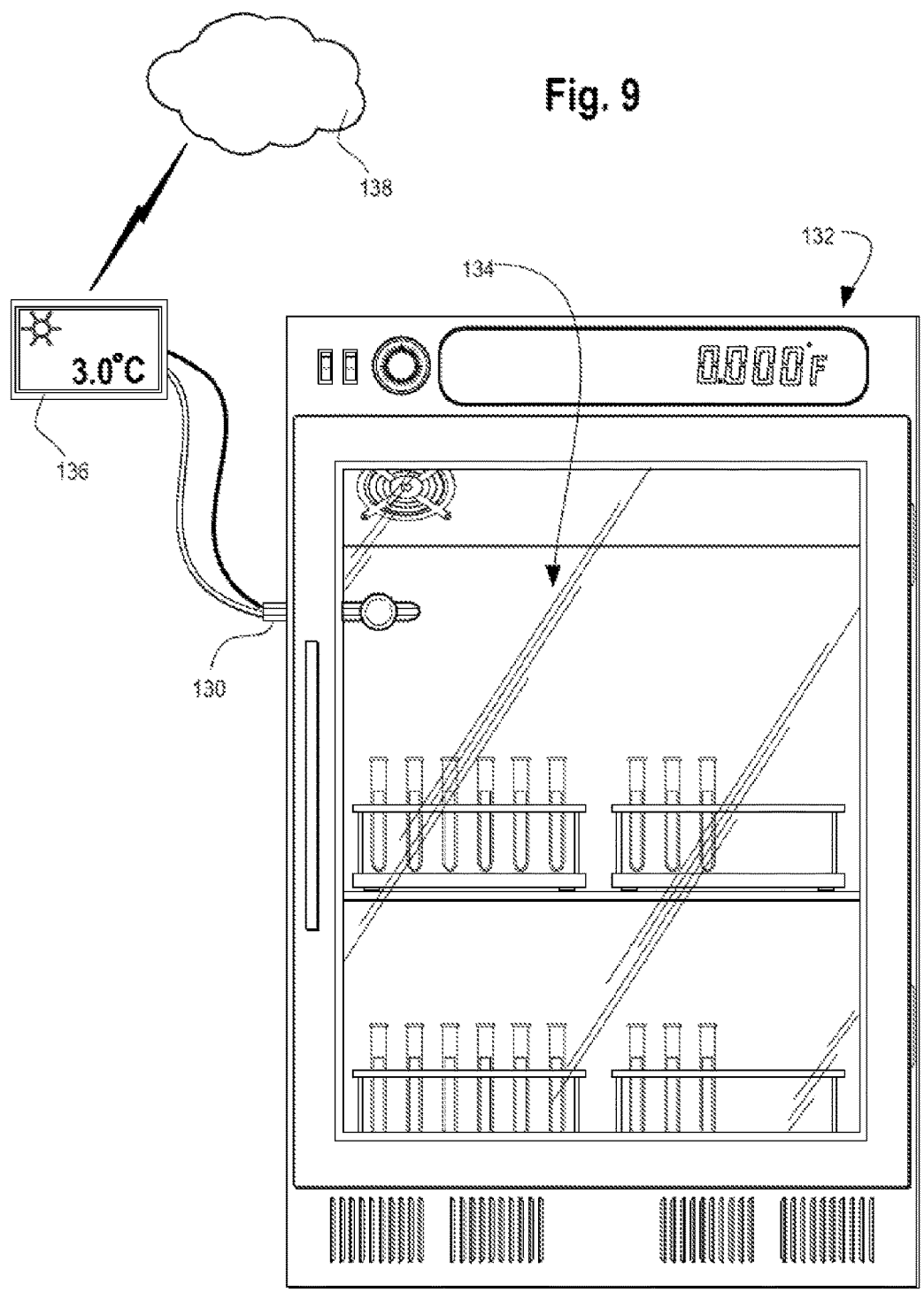
FIG. 9 is a schematic representation of a logger installed in a storage device in accordance with an embodiment of the present disclosure.

FIG. 9 shows sensor unit 130 applied to a refrigeration device 132. The sensor unit 130 is positioned in the refrigerated chamber 134 to monitor the temperature therein. The FFC operatively connects the sensor unit 130 to a data logging device 136 (a "logger"). The logger 136 records and stores temperature data detected by the sensor module 100. The logger is located external to the refrigerated chamber 134. The logger 136 may be configured to provide real time alerts when an "out-of-range" temperature reading is detected.

In an embodiment, the logger 136 is a stand-alone device. The logger collects and stores sensor data from the sensor unit 130. The stored sensor data can be retrieved for analysis. A nonlimiting example of a stand-alone logger is a logger (and sensor unit) placed in a shipping container for sensitive items. Upon receipt of the shipping container, a person downloads and reviews the data stored on the logger to determine whether the conditions during transport/shipping of the sensitive item were maintained in acceptable tolerance during shipping.

In an embodiment, the logger 136 operatively communicates with a monitor and control system. The monitor and control system may include (i) one or more computing devices, (ii) one or more servers, and (iii) a combination of (i) and (ii). The monitor and control system reads the temperature and/or other data from the logger 136 in real time. The monitor and control system may display an alert real time in the event an "out-of-range" temperature reading is detected. The monitor and control system can also be used to analyze the data, to monitor conditions within the refrigerated chamber 134 and/or to adjust the temperature within the refrigerated chamber 134 as desired. Communication between the logger 136 and the control system may be by way of wire connection or by way of wireless connection 138, (Bluetooth, the Internet, the Web, or the Cloud).

8. Electronic Device

The present disclosure provides an electronic device. In an embodiment, the electronic device includes a substrate and one or more electrical components electrically connected to the substrate. The electronic device also includes a sensor module electrically connected to the substrate.

The substrate can be any substrate as previously disclosed herein. The substrate for the electronic device is different than substrate 10. In an embodiment, the substrate is a PCB.

The electrical component can be one or more microcontroller, communication component, memory component, frequency crystal, power regulation component, power source (such as a battery, for example), antenna, application specific integrated circuit, capacitor, diode, optoelectronic device, transducer, transistor, switch, resistor, and any combination thereof. The communication component is suitable for wired communication and/or wireless communication.

The sensor module of the electronic device can be any sensor module as previously disclosed herein. The sensor module includes a panel comprising a pair of opposing sides and a pair of opposing edges. The sensor module includes at least two continuous traces extending along the panel. Each trace has opposing ends. Each trace end has an exposed area at each edge. The sensor module includes a sensor chip. The sensor chip is electrically connected to each trace.

In an embodiment, the electrical component and the sensor module each is electrically connected to the substrate, the substrate being a PCB. Nonlimiting examples of suitable electrical connections between the electrical component/sensor module and the PCB include header pins, edge connector, plug, solder, and any combination thereof.

In an embodiment, the electronic device includes a PCB having an edge connector for electrically connecting the sensor module to an edge of the substrate.

In an embodiment, the substrate is a PCB having a circular shape from plan view. The PCB includes one or more electrical components electrically connected to a surface thereof. The PCB includes a cut-out section for receiving the sensor module. The cut-out section includes an edge connector for receiving (and electrically connecting to) one of the exposed edges of the sensor module. The sensor module attaches to the PCB by way of the edge connector. When the sensor module is attached into the cut-out section, the PCB maintains its circular shape, or maintains a substantially circular shape, from plan view. In a further embodiment, the electronic device includes a battery electrically connected to the PCB (in addition to the one or more electrical components), the electronic device has a circular shape from plan view with the sensor module attached in the cut-out section. The electronic device has a diameter from 2.0 cm, or 2.25 cm, or 2.5 cm, or 2.54 cm to 2.75 cm, or 3.0 cm, or 3.25 cm, and the electronic device also has a height from 0.4 cm, or 0.5 cm, or 0.6 cm to 0.7, or 0.8 cm.

In an embodiment, the panel of the sensor module includes holes to receive and support header pins. The electronic device includes the sensor module electrically connected to the PCB by press fitting the header pins into surface mount holes and/or through-holes present on the PCB.

Other nonlimiting examples of suitable applications for the present sensor module and/or the present sensor unit include: storage and shipping containers, and particularly for sensitive materials such as medicine, genetic material, human organs, biomass (either refrigerated, cryogenic, or un-refrigerated); vehicles; warehouses, dwellings (homes, buildings) where sensors monitor room temperature conditions to determine energy usage; grain storage where sensors monitor conditions to mitigate mildew and insect activity; heat treating kilns; smokehouses and food drying; quality control of food storage, food service, food transport, or food preparation; sensor applications where temperature and humidity are monitored to prevent bacteria and/or spoilage;

sensor applications for monitoring curing conditions for plastics and adhesives; autoclaves; and sterilizers.

It is specifically intended that the present disclosure not be limited to the embodiments and illustrations contained herein, but include modified forms of those embodiments including portions of the embodiments and combinations of elements of different embodiments as come within the scope of the following claims.

The invention claimed is:

1. A method comprising:
   providing a substrate comprising
   (i) plurality of panels,
   (ii) at least two continuous traces extending along the substrate and along each panel,
   (iii) a sensor chip mounted on each respective panel, each sensor chip in electrical connection with the traces;
   placing the substrate in a test apparatus under test conditions;
   connecting a data collection apparatus (DCA) to the traces;
   transmitting, from the DCA, a signal to each sensor chip;
   receiving, by the controller, a sensor value from each sensor chip; and
   comparing with the controller, the sensor value from each sensor chip to a reference value.

2. The method of claim 1 comprising placing the substrate under test conditions in a laboratory accredited to ISO 17025.

3. The method of claim 1 wherein the comparing step is performed for each chip while the substrate is in the test apparatus.

4. The method of claim 3 wherein the substrate comprises from 2 to 300 sensor chips, the process comprising comparing the sensor value from each of the 2 to 300 sensor chips to a reference value while the substrate is in the test apparatus.

5. The method of claim 1 wherein the transmitting comprises querying an address from each sensor chip; and receiving, by the DCA, a unique identification number from each sensor chip.

6. The method of claim 5 comprising recording the identification number, the sensed value and the reference value for each sensor chip; and determining whether the sensed value is within a predetermined tolerance.

7. The method of claim 6 wherein, when the sensed value is outside the predetermined tolerance;
   sending a correction signal to the sensor chip; and
   receiving a confirmation reading from the sensor chip.

8. The method of claim 6 comprising removing the substrate from the test apparatus; and
   singulating the panels from the substrate, each singulated panel forming a respective sensor module.

9. The method of claim 8 comprising matching the identification number for each sensor module to the recorded identification number in the controller; and
   segregating sensor modules with sensor values outside the predetermined tolerance.

10. The method of claim 8 comprising placing the sensor module into electrical connection with a cable.

11. The method of claim 10 comprising encapsulating the sensor module with a protective material.

12. A sensor module comprising:
    a panel comprising a pair of opposing sides and a pair of opposing edges;
    at least two continuous traces extending along the panel, each trace having opposing ends, each trace end having an exposed area at each edge; and
    a sensor chip, the sensor chip electrically connected to each trace.

13. The sensor module of claim 12 wherein the panel is singulated from a printed circuit board substrate.

14. The sensor module of claim 13 wherein the sensor chip is a calibrated sensor chip.

15. The sensor module of claim 12 comprising a cable having two or more conductors; and at least one exposed area is in electrical connection with each conductor of the cable.

16. The sensor module of claim 15 comprising a protective material, the protective material encapsulating the sensor module.

* * * * *